United States Patent [19]

Lemelson

[11] Patent Number: 5,288,556
[45] Date of Patent: Feb. 22, 1994

[54] GEARS AND GEAR ASSEMBLIES

[76] Inventor: Jerome H. Lemelson, 930 Tahoe Blvd., Unit 802, Incline Village, Nev. 89451-9436

[21] Appl. No.: 765,447

[22] Filed: Sep. 25, 1991

Related U.S. Application Data

[63] Continuation-in-part of Ser. No. 488,116, Mar. 5, 1990, abandoned, which is a continuation-in-part of Ser. No. 32,352, Mar. 31, 1987, Pat. No. 4,960,643, and a continuation-in-part of Ser. No. 32,307, Mar. 31, 1987, Pat. No. 4,859,493.

[51] Int. Cl.$^5$ ............................................. F16H 55/17
[52] U.S. Cl. ...................................... 428/408; 74/457; 74/458; 74/459.5; 74/467; 74/468; 428/216; 428/336; 428/457; 428/698; 428/699; 428/704
[58] Field of Search ..................... 409/66; 407/27; 51/206 P, 287, 293; 428/408, 457, 216, 336, 698, 699, 704; 74/457, 458, 459.5, 467, 468

[56] References Cited

U.S. PATENT DOCUMENTS

| | | | |
|---|---|---|---|
| 2,411,867 | 12/1946 | Brenner | 428/408 |
| 2,947,610 | 8/1960 | Hall | 425/DIG. 26 |
| 3,141,746 | 7/1964 | DeLai | 425/DIG. 26 |
| 3,306,720 | 2/1967 | Darrow | 425/DIG. 26 |
| 3,602,209 | 8/1971 | Bocker | 51/206 P |
| 3,702,573 | 11/1972 | Nemeth | 423/446 |
| 3,714,332 | 1/1973 | Rasquin | 423/446 |
| 3,778,586 | 12/1973 | Breton et al. | 219/149 |
| 3,913,280 | 10/1975 | Hall | 264/125 |
| 3,959,557 | 5/1976 | Berry | 428/457 |
| 4,077,164 | 3/1978 | Peterman, Jr. | 51/206 P |
| 4,084,942 | 4/1978 | Villalobos | 264/125 |
| 4,228,142 | 10/1980 | Holcombe, Jr. et al. | 423/446 |
| 4,354,328 | 10/1982 | Ainoura | 51/206.4 |
| 4,385,880 | 5/1983 | Lemelson | 425/77 |
| 4,475,319 | 10/1984 | Wirz | 409/66 |
| 4,610,577 | 9/1986 | Spensberger | 407/27 |
| 4,693,231 | 9/1987 | Buschmeier | 51/287 |
| 4,707,384 | 11/1987 | Schachner et al. | 428/408 |
| 4,844,719 | 7/1989 | Toyomoto et al. | 55/16 |
| 4,859,493 | 8/1989 | Lemelson | 427/45.1 |
| 4,874,596 | 10/1989 | Lemelson | 423/446 |
| 4,904,542 | 2/1990 | Mroczkowski | 416/241 B |
| 4,920,703 | 5/1990 | Hosoya | 51/287 |
| 4,960,643 | 10/1990 | Lemelson | 252/29 |
| 4,971,602 | 11/1990 | Crawford | 51/293 |
| 4,974,498 | 12/1990 | Lemelson | 92/223 |
| 5,096,352 | 3/1992 | Lemelson | 411/424 |
| 5,131,941 | 7/1992 | Lemelson | 75/10.19 |

Primary Examiner—A. A. Turner
Attorney, Agent, or Firm—Steven G. Lisa

[57] ABSTRACT

Improvements in gears and gear teeth structures for use in driving assemblies, such as machines, vehicles and the like, wherein the teeth portions of the gears and, in certain instances, other portions thereof, are coated with a hard synthetic diamond material deposited thereagainst as carbon atoms derived from a fluid, such as methane gas, when high energy radiation, such as microwave radiation, is beamed through the gas against the surfaces of the gears and gear teeth thereof. In certain instances, the hard diamond material coating the gear teeth and the spaces therebetween, is overcoated with a thin layer of chromium which serves to protect the diamond surfaces of the teeth during use so as to prevent destruction of the diamond layer by physical attrition caused by stress and abrasive particles engaging the teeth during use of the gears. In a particular form of the invention, two or more gears having their teeth similarly coated with synthetic diamond material are assembled in meshing engagement with each other and a coating of chromium disposed on the outer surfaces of the diamond material coating the teeth serves to lubricate and protect the diamond coating against destruction or attrition as the gears mesh and are driven with respect to each other.

27 Claims, 1 Drawing Sheet

GEARS AND GEAR ASSEMBLIES

RELATED APPLICATIONS

This is a continuation-in-part of U.S. patent application Ser. No. 07/488,116 filed Mar. 5, 1990, now abandoned which in turn was a continuation-in-part of U.S. patent application Ser. No. 032,352 filed Mar. 31, 1987, now U.S. Pat. No. 4,960,643, and U.S. patent application Ser. No. 032,307, filed Mar. 31, 1987, now U.S. Pat. No. 4,859,493.

SUMMARY OF THE INVENTION

This invention relates to improvements in gears, such as machine gears used to drive machine elements and the like, which improvements are attained as a result of producing the gears to receive and retain coatings of synthetic diamond material and, in certain instances, overcoatings of chromium, chromium alloy and/or other suitable solid lubricant material. The synthetic diamond material serves to protect the gear teeth against surface erosion caused by stress and/or particles of abrasive material caught between mating teeth during operation of the gears and to enhance the surface characteristics of the gear teeth, such as by preventing the spread or growth of microsurface cracks when the gear teeth are subjected to high compressive and bending forces during use.

Accordingly it is a primary object of this invention to provide a new and improved structure in a solid gear employed to drive or be driven to transmit energy in the form of shaft rotation in a machine assembly.

Another object is to provide an improved gear for use in machines and the like which is formed of a solid base shaped with a multitude of gear teeth projecting outwardly therefrom to be engaged with the teeth of another gear or gears in such machine assembly, wherein at least the teeth of the gear, if not the entire gear itself, are coated with a hard synthetic diamond material formed in situ thereon by deposition from a fluid such as liquid, vapor or gas containing carbon atoms deposited as a result of high intensity radiation, such as microwave radiation, beamed through the fluid adjacent the gear and gear teeth and caused to deposit from such fluid by such high intensity radiation as generated, for example, by a microwave generator. Details of such diamond film formation are described in my U.S. Pat. No. 4,859,493 and references cited therein, which describe apparatus for depositing film of a few millionths of an inch thick to a thousandths of an inch thick or more depending on the intensity of the radiation and the time it is applied through the carbon atom containing fluid adjacent the surface of the gear blank or teeth of the gears to be coated.

Accordingly it is a primary object of this invention to provide a new and improved structure in a tooth gear wherein the teeth of such gear are properly configured and are directly coated with a thin layer of synthetic diamond material which substantially enhances and improves the surface characteristics of the gear teeth. The gears may be of any type including spur, level or worm.

Another object is to provide improved structures in gear teeth which are increased in strength by at least 10% by means of a synthetic diamond material deposited as a layer thereon.

Another object is to provide improved structures in gear teeth which are enhanced in wear and abrasion resistance characteristics and which also do not cause undue wear or abrasion of the teeth on a mating gear rack or rotating gear member.

Another object is to provide improved structures in gear teeth which are enhanced in their ability to resist chemical corrosion in use by reason of the synthetic diamond material that is applied in situ as a coating on a gear that may have been formed by a process such as casting, pressure injection molding or sintering.

Another object is to provide a new and improved gear assembly having two or more gears in meshing engagement wherein at least the teeths of such gears which mesh are strengthened by a first coating of a hard material, such as synthetic diamond and are lubricated or protected by a second material which overlays the surface of the hard material, which may be a hard solid lubricating material which serves also to protect the synthetic diamond coating from wear and attrition. The solid lubricant is preferably selected from the group of metals or alloys of chromium, vanadium, molybdenum, titanium, or silicon and oxides, carbides, nitrides and sulfides thereof.

Another object is to provide new and improved gears formed of matrix material, such as metal, containing particles and/or filaments of hard reinforcing high strength material such as synthetic diamond wherein the teeth of the gears are also further strengthened with a non-abrasive coating of synthetic diamond.

Another object is to provide a method for repairing and renovating coatings and surface stratum of objects where the surface structure is subject to erosion due to wear, such as in gears and the like while assembled or in use.

It is still another primary object of this invention to provide a new and improved toothed gear for use in a drive for a movable component or assembly of a machine wherein at least the active surface of the teeth of said gear are coated with a hard synthetic diamond material formed in situ. By coating at least those surfaces of said teeth which engage the corresponding surfaces on teeth of another gear the wear characteristics of the gear and teeth thereof are improved such as to extend the life of the gears and maintain proper and constant operation thereof for an extended period of time.

Another object is to provide an improved toothed gear for use in a drive for a machine element or assembly which gear is coated with a hard diamond-like material formed in situ on all surfaces of the gear and serves to strengthen the gear and prevent excess wear or destruction of its teeth by filling in microcracks and cavities in the surfaces of the gear teeth and gear base, thereby reducing the possibility of failure of the gear during use and enhancing its strength.

Another object is to provide a method for enhancing the strength of metal gears by coating the teeth thereof with hard synthetic diamond material formed in situ thereon, which synthetic diamond material is overcoated with a thin layer of chromium plated or deposited in situ thereon which serves as a drive lubricant for the diamond material, thereby greatly increasing the life of the diamond coating or film therebeneath.

With the above and such other objects in view as may hereinafter more fully appear, the invention consists of the novel structures, article constructions and method described in the following specification and illustrated in the drawings, but it is to be understood that variations and modifications may be resorted to which fall within the scope of the invention as claimed without departing from the nature and spirit of the invention.

DETAILED DESCRIPTION OF PREFERRED EMBODIMENTS

Figure 1:
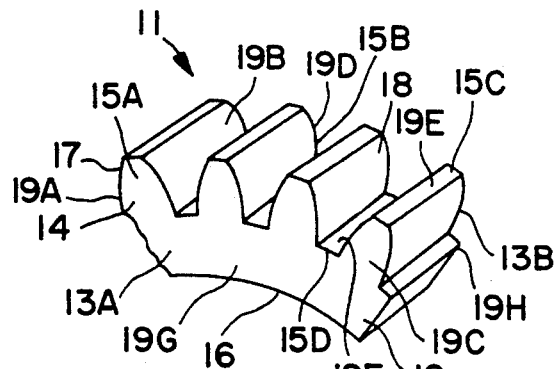
FIG. 1 is a partial isometric view of a portion of a circular spur gear which contains one or more hard protective and strengthening layers of material covering either just the teeth of the gear or the entire outer surface thereof.
Figure 2:
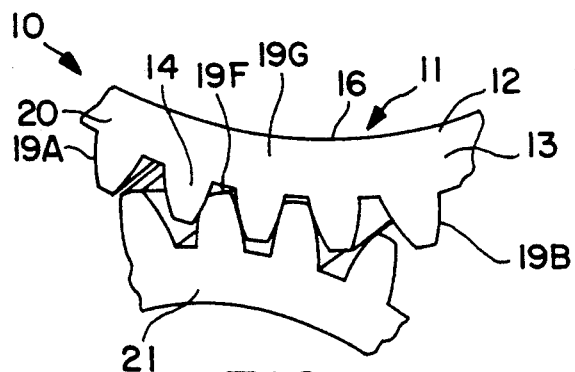
FIG. 2 is a partial side view of portions of two spur gears, each coated with one or more layers of protective and reenforcing materials such as synthetic diamond and chromium.
Figure 3:
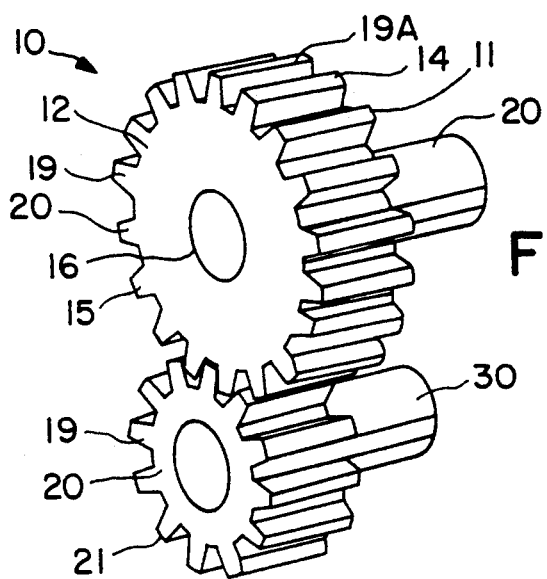
FIG. 3 is an isometric view of an assembly of two gears of the type shown in FIG. 2.

In FIGS. 1 to 3 is shown improvements in gears and gear drive assemblies used in mechanical and electromechanical devices and machines to position and drive shafts and shaft assemblies. In FIGS. 2 and 3 a gear assembly 10 is formed of two spur gears 11 and 21 shown in driving mesh arrangement with each gear being secured to respective shafts 20 and 30 for rotation thereon or therewith. The gears may have other configurations with helical, spiral or otherwise shaped teeth to form a worm gear and may be assembled in a train or trains having additional other gear structures including bevel gears and gear racks.

Typical structure of the gears of FIGS. 2 and 3 is shown in FIG. 1 which illustrates a fragment of the gear 11. A plurality of spur gear teeth 14 extend radially outwardly from the base 12 of the gear, which base contains a central bore 16 and has parallel flat side faces 13A and 13B. The gear may be machined from metal or ceramic stock or may be molded, forged or cast to shape from suitable metal, ceramic or plastic materials. It may also be sintered from particles of metal, ceramic or synthetic diamond material.

The curve of the side walls of each gear tooth 14 is an involute curve computed from the base circle of the gear which is just below the pitch circle and is at the point at which the involute curve from the top of the tooth ends. The tooth terminates in a straight radial flank to the root. Each gear tooth 14 is thus defined by flat side faces 15A and 15B which are extensions of the flat side walls of the base 12, curved side walls 17 and 18 which experience frictional wear due to moving contact under load with teeth of the meshing gear (21), a terminal or end surface 15C and a portion of the flat or circular surfaces 15D extending between teeth at the roots thereof. Involute gear teeth may be used in bevel gears and gear racks. The central cylindrical bore 16 may be press fit or otherwise secured as by use of a key or splines to the shaft 20 which rotates freely, or the gear may be secured to a bearing in which the gear rotates for certain gear train applications.

Figure 4:
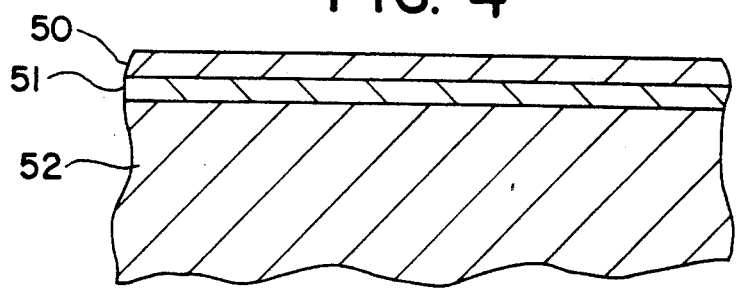
FIG. 4. is a side view in cross section of a fragment of one of the gears of FIGS. 2 and 3.

In FIGS. 1 to 3, the entire outer surfaces of the gears 11 and 21 containing coating material deposited thereon after the gears are completely fabricated, which comprises or includes a first layer 19 of synthetic diamond. For most applications, a second layer 20 is deposited on the first layer and comprises a solid material, such as chromium, which serves a number of useful purposes acting as a solid lubricant reducing sliding friction between gear teeth and as a protective coating for the under layer or film of synthetic diamond. Such synthetic diamond coating 19 provides a hard impact resistant layer for the gear teeth and the gear in general, resisting failure due to the formation and expansion of surface cracks and pits. It also serves to protect the gear against chemical attack and the erosive effects of small particles such as machining burrs and particles often found in or contained by a lubricant such as grease or oil. The overcoating 20, which may comprise chromium, chromium alloy, vanadium, titanium, tungsten, silicon, molybdenum or alloys thereof or combinations of such metals or alloys, may be deposited electrically, electrolessly, by vapor, radiation, plasma or spray means, is preferably deposition bonded to the outer surface of the diamond layer 51 (FIG. 4).

The synthetic diamond coating 51 is preferably formed from carbon atoms stripped or separated from molecules of a carbon atom containing gas, such as methane by passing intense microwave energy beamed through the gas against the surface of the gear, as set forth in my U.S. Pat. No. 4,859,493. It is contemplated that other processes may be used. The synthetic diamond may be applied in film or coating thicknesses, as one or more layers thereof, varying from a few millionths of an inch to one or more thousandths of an inch depending on the application requirements such as gear size, loading and impact forces during use, etc. The outer protective layer 50 may vary from less than a thousandth of an inch to several thousandths of an inch or more again depending on the loading, impact forces and wear expected during use of the gear. The protective layer 50 may also serve to add strength to the gear and its teeth complementing the high strength imparted by the undercoating of synthetic diamond.

In modified forms of the invention, the diamond and/or chromium overcoating materials may be applied just to select or all surfaces of the gear teeth, a select annular portion of the side walls 15 of the gear including the portions 15A and 15B thereof which define the teeth and/or to the inside surface of the bore 16, per se or in combination with other portions of the gear. The primary function of the coating materials is to protect underlying material, and especially the teeth, against damage due to crack formation and failure and for certain applications it may just be necessary to merely coat the teeth of the gear. Notations 19A, 19B, 19C, 19D, 19E and 19F thus respectively refer to those portions of the synthetic diamond coating covering respectively the side walls, 17 and 18, the flat side faces 15A and 15B, the tip or terminal surface 15C and the adjacent portions of the root surfaces 15D of each tooth. Those portions of the synthetic diamond coating covering the remaining portions of the flat side walls or faces 13A and 13B of the gear are referred to by notations 19G and 19H.

In maintaining gears of the type described above, the hard chromium outer coating material 20 may be replenished by plating or vapor deposition means while the gears are in mesh and turning either in use or slowly rotated without the need to disassemble the gears. Suitable coating and deposition radiation, such as microwave radiation, may be generated and directed through a coating material containing gas or vapor directed at such meshed gears while they are slowly rotated or faster rotated in use, to effect the deposition of either or both coating materials including atoms of carbon to form the hard diamond film where needed for repair, replenishment or initial layer.

In FIG. 4 is shown structural details of the synthetic diamond coatings, the protective overcoatings and the substrates coated. The substrate, which may be any of the configurations hereinabove described, is denoted 50 and is made of suitable metal, metal alloy, cermet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millionths of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousandths of an inch or more and preferably in the range of a few thousandths of an inch or less.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or applied sequentially after the deposition of carbon atoms to provide either a composite layer of carbon and chromium atoms or one or more layers of carbon atoms interposed between one or more layers of chromium atoms or coatings thereof.

Certain modifications to the structures and methods for making same may be found in my U.S. Pat. Nos. 4,859,493 and 4,960,643, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer surface or surfaces of the articles to the exclusion of another area or areas thereof for functional and/or economic purposes. Such an electron beam or laser beam may be employed in combination with microwave radiation and passed through a carbon atom containing gas, such as methane, surrounding all or part of the articles or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with coatings selected from the group of metals and alloys of chromium, vanadium, tungsten, titanium, silicon, and molybdenum and oxides, carbides, nitrides and sulfides thereof which serve to protect and/or lubricate the surface of the synthetic diamond coatings to resist frictional wear and abrasion during operating and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubricate and protect the surface of the synthetic diamond coating.

4. Coatings formed of a plurality of layers of synthetic diamond material formed as described between respective layers of the same or different metals, metal alloys and/or ceramic materials may be employed to enhance the physical, chemical resistance and electrical characteristics of the articles described. Such multiple coatings may also be employed to substantially enhance the strength and stiffness of the articles.

5. Certain of the articles of manufacture described above may be fabricated by compressing particles of metal, various ceramic materials or mixtures of either or both materials with fine particles of synthetic diamond produced, for example, as set forth in my U.S. Pat. No. 4,859,493 and employed to strengthen the composite. Short filaments of synthetic diamond or composites thereof as set forth in such patent may also be mixed with such particulate material(s) to form articles of the type(s) described herein having superior substrate strength and corrosion resistance. Compression of such mixture(s) between dies with or without the addition of a resin binder while simultaneous and/or sequentially heating same to effect sintering or otherwise consolidating the metal particles into a defined shape may be effected prior to the described coating with synthetic diamond material.

6. The described articles may also be formed by compressing particulate material with resinous binder particles, then sintering at temperature to burn away the resin leaving a porous substrate of desired shape. By placing such porous substrate in a chamber containing a mixture of hydrocarbon gas and hydrogen under pressure, molecules of the gas mixture will flow into the pores or interstices of such substrate, particularly if the chamber and substrate therein are first subjected to suitable vacuum. Thereafter by generating and directing suitable microwave energy through the gas and substrate, carbon atoms will be stripped from the gas molecules containing same and will form as synthetic diamond or diamond-like material on the surfaces of the walls of the internal interstices, thus providing a new high strength structure of select external shape which is internally reinforced with synthetic diamond material and is externally coated with such material providing a hard outer shell which is highly resistant to erosion, surface attrition, wear and chemical corrosion.

7. The term synthetic diamond material employed herein refers to high strength coatings, filaments or particles of carbon exhibiting the chemical and physical characteristics (e.g. strength) of diamond. For certain of the articles and applications described above, the carbon atoms stripped from the molecules of hydrocarbon gas, such as methane, by microwave energy may form hard high strength coatings which do not quite exhibit the hardness of diamond but will suffice for many applications. The coatings may be non-abrasive so as to reduce wear due to abrasion on a mating gear member, which is particularly important to providing an extended life for a small pinion or worm gear in a mechanical drive.

What is claimed is:

1. A gear assembly comprising in combination:
   (a) at least two gears, each of which is formed of a substrate having a base and a surface defining a plurality of teeth,
   (b) means for supporting said gears in positions so as to mesh with each other and so that driving one of said gears will drive at least one other of said gears by engaging at least a select surface portion of the teeth of each of the gears, and
   (c) a non-abrasive coating deposited on at least said select surface portions of said teeth of said gears comprising a hard synthetic diamond material.

2. A gear assembly in accordance with claim 1 including a solid lubricating overcoating on said synthetic diamond material.

3. A gear assembly in accordance with claim 2 wherein said solid lubricant comprises a thin layer of chromium.

4. A gear assembly in accordance with claim 2 wherein said solid lubricant comprises a chromium alloy.

5. A gear assembly in accordance with claim 1 wherein said hard synthetic diamond material coats all of the outer surfaces of said gears.

6. A gear assembly in accordance with claim 1 wherein said gears are spur gears having meshed teeth, and wherein said select surface portions comprise side walls of the teeth.

7. A gear assembly in accordance with claim 1 wherein said gears are bevel gears having meshed teeth, and wherein said select surface portions comprise side walls of the teeth.

8. A gear assembly in accordance with claim 1 wherein said gears include a worm gear, and wherein said select surface portions comprise side walls of the teeth.

9. A gear suitable for transmitting energy as shaft rotation in a mechanical drive assembly comprising:
   (a) a gear base formed of a hard material and having a central portion supporting a plurality of gear teeth extending outwardly from said central portion, and
   (b) a hard, non-abrasive synthetic diamond coating formed in situ on at least a portion of said teeth needed to protect said teeth against wear during the operation of said gear.

10. A gear assembly in accordance with claim 9 wherein said synthetic diamond coating is thick enough to enhance the strength of the teeth of said gear by at least ten percent.

11. A gear assembly in accordance with claim 10 wherein the gear and gear teeth are made of metal, and wherein the gear comprises a worm gear.

12. A gear assembly in accordance with claim 10 wherein the gear and gear teeth are made of metal, and wherein the gear comprises a spur gear.

13. A gear assembly in accordance with claim 10 wherein the gear and gear teeth are made of metal, and wherein the gear comprises a bevel gear.

14. A gear in accordance with claim 9 including a solid lubricant overcoating on the outer surface of said synthetic diamond coating.

15. A gear in accordance with claim 9 in which said hard synthetic diamond material costs the entire outer surface of said gear.

16. A gear in accordance with claim 14 having its entire outer surface including the surfaces of said teeth coated with said solid lubricant.

17. A gear in accordance with claim 14 wherein said solid lubricant is selected from the group of metals and alloys of chromium, vanadium, molybdenum, titanium, tungsten, and silicon and oxides, carbides, nitrides, and sulfides thereof.

18. A gear for use in a gear drive comprising:
   (a) a gear base,
   (b) gear teeth formed in and projecting outwardly form said gear base, and
   (c) a layer of non-abrasive synthetic diamond material coating at least said gear teeth.

19. A gear in accordance with claim 18 wherein said synthetic diamond material coats the entire outer surface of said gear including said gear teeth and said gear base.

20. A gear in accordance with claim 18 wherein the thickness of said synthetic diamond material is in the range of 0.00001 inches to 0.001 inches.

21. A gear in accordance with claim 18 wherein the thickness of said synthetic diamond material is in the range of less than 0.00001 inches.

22. A gear in accordance with claim 18 including a layer of a hard protective material overcoating said layer of synthetic diamond material, said protective material being applied to have a thickness in the range of 0.001" to 0.010".

23. A gear in accordance with claim 18 wherein said gear base contains pores filled with synthetic diamond material evenly distributed throughout a metal matrix and formed by one of the processes including casting, pressure injection molding, and sintering.

24. A gear in accordance with claim 18 wherein said coating is comprised of a plurality of layers of synthetic diamond material formed between other layers of material selected from the group of metals, metal alloys, and ceramics.

25. A gear in accordance with claim 18 including a solid lubricant overcoating on the outer surface of said synthetic diamond coating.

26. A gear in accordance with claim 18 wherein said synthetic diamond coating comprises a layer of carbon atoms stripped from carbon-containing molecules by microwave radiation directed at said "at least said gear teeth".

27. A gear in accordance with claim 18 wherein said synthetic diamond coating includes some material that has been applied while the gear is in operation.

* * * * *